US008705768B2

(12) United States Patent
Aiso et al.

(10) Patent No.: US 8,705,768 B2
(45) Date of Patent: Apr. 22, 2014

(54) MIXING APPARATUS AND COMPUTER PROGRAM THEREFOR

(75) Inventors: Masaru Aiso, Hamamatsu (JP); Masaaki Okabayashi, Hamamatsu (JP); Takamitsu Aoki, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1561 days.

(21) Appl. No.: 11/494,163

(22) Filed: Jul. 26, 2006

(65) Prior Publication Data

US 2007/0025568 A1 Feb. 1, 2007

(30) Foreign Application Priority Data

Jul. 29, 2005 (JP) ................................. 2005-222148

(51) Int. Cl.
*H04B 1/00* (2006.01)
*H03G 3/00* (2006.01)
*H03G 7/00* (2006.01)

(52) U.S. Cl.
USPC ............................ 381/119; 381/104; 381/107

(58) Field of Classification Search
USPC .............. 381/119, 102-109, 118, 91; 84/660, 84/615, 625; 700/94
See application file for complete search history.

(56) References Cited

U.S. PATENT DOCUMENTS 7,831,054 B2 * 11/2010 Ball et al. ...................... 381/104
2005/0249364 A1 * 11/2005 Makino et al. ................ 381/119

FOREIGN PATENT DOCUMENTS

JP 2004-112162 4/2004

OTHER PUBLICATIONS

PM1 D Digital Audio Mixing System Owners Manual, includes "Information regarding PM1 D System Software V1.41", "CSD1 Control Surface Reference Manual and Appendices", Yamaha Corporation.*

PM1 D Digital Audio Mixing System Owners Manual includes "information regarding PM1 D System Software V1.41", "CSD1 Control Surface Reference Manual and Appendices", CSD1 Reference Manual ( )Hardware).*

PM1 D Digital Audio Mixing System Owner's Manual includes "information regarding PM1 D System Software V1.41", "CSD1 Control Surface Reference Manual and Appendices", CSD1 Reference Manual (Hardware).*

"Instruction Manual Digital Mixer D-901 Version 3", Dec. 2004; TOA Electronics.*

PM1D Digital Audio Mixing System Owner's Manual, includes "Information regarding PM1D System Software V1.41", "CS1D Control Surface Reference Manual and Appendices", Yamaha Corporation, Japan.

* cited by examiner

*Primary Examiner* — Mohammad Islam
*Assistant Examiner* — David Ton
(74) *Attorney, Agent, or Firm* — Morrison & Foerster LLP

(57) ABSTRACT

Digital mixer includes a plurality of input ports each capable of performing gain adjustment, and a plurality of signal processing channels. Signal of each of the input ports is allocated to one or more desired ones of the channels. Each of the input channels includes an attenuator and can control the level of each signal supplied thereto. Gain value of any one of the input ports is updated in accordance with the gain adjustment performed in that input port, and, when an automatic gain adjustment function is ON in any one of the input channels set as patched-to destinations of the input port, an attenuator value of the input channel is automatically adjusted so as to cancel out an amount of variation of the gain value.

16 Claims, 4 Drawing Sheets

MIXING APPARATUS AND COMPUTER PROGRAM THEREFOR

BACKGROUND OF THE INVENTION

The present invention relates to mixing apparatus which mix audio signals, and computer programs for the mixing apparatus.

As well known, audio mixers are mixing apparatus which include a predetermined plurality of mixing buses and which mix a plurality of audio signals, via the mixing buses, at desired tone volume levels. Digital mixers are mixing apparatus which perform mixing processing and other necessary processing, such as effect impartment, through digital signal processing. In such digital mixers, audio signals, such as tone signals and digital audio signals, input via a plurality of input ports, are allocated and supplied to desired one or ones of a plurality of input channels. Each of the input channels adjusts characteristics and level of the signal allocated thereto and then supplies the thus adjusted signal to desired mixing buses. Each of the mixing buses mixes a plurality of the digital signals supplied from the input channels and supplies the resultant mixed signals to corresponding output channels. Each of the output channels adjusts characteristics and level of the supplied signal and then outputs the thus-adjusted signal to the outside of the mixer. Among examples of digital mixers of the above-discussed type is a digital mixer marketed by the assignee of the instant application under the product name "PM1D" (see, for example, http://www.2.yamaha.co.jp/manual/pdf/pa/japan/mixers/PM1D_ManagerJ.pdf).

In this specification, allocating signals of input ports to input channels or allocating output signals of output channels to output ports will be referred to as "patch" or "patching", and setting data of such patching will be referred to as "patch data". Allocation (or patching) of the signals from the input ports to the input channels is performed by an "input patch" section, while allocation (or patching) of the signals from the output channels to the output ports is performed by an "output patch" section.

Generally, the digital mixers, such as the one marketed under the product name "PM1D" mentioned above, are provided with a plurality of input ports including analog input ports each for inputting an analog audio signal and digital input ports each for inputting a digital audio signal.

The analog input port is provided with a gain-variable amplifier and A/D converter. Analog audio signal input to the analog input port is appropriately adjusted in amplitude level by the gain-variable amplifier and then converted via the A/D converter into a digital audio signal. Then, the thus-converted digital audio signal is supplied via the input patch section to one or more input channels that are patched-to destinations of the analog input port (i.e., "patched-to input channels"). Further, the digital input port, which may comprise a digital audio I/O based on the AES/EBU, ADAT, TDIF or other standard or an audio network I/O like the Cobranet (trademark) or mLAN (trademark), is capable of inputting a plurality of digital audio signals by means of a single cable.

Via a gain control mechanism provided in the analog input port, the user is allowed to adjust the input analog audio signal to an optimal gain level that can reliably prevent the A/D-converted digital signal from assuming too small a level and prevent signal clipping from occurring due to an excessive input to the A/D converter or excessive gain of the A/D converter. However, if the gain of the analog input port is adjusted, signals to be processed in input channels that are patched-to destinations of (i.e., patched-to input channels connected to) the analog input port, namely, signals that are supplied via the patched-to input channels to the mixing buses, would vary in level, which thereby undesirably influences a mixing level ratio among the signals.

At an input stage of each of the input channels, there is provided a level control mechanism called "attenuator" which attenuates or amplifies the level of the audio signal input to the channel in question. This attenuator is provided to appropriately adjust the level of the audio signal, input to the channel, with effects of an equalizer etc., provided at subsequent stages, taken into consideration.

When gain adjustment has been performed in the analog input port and if the attenuator of a given patched-to input channel connected with the analog input port is adjusted to cancel out level variation having occurred due to the gain adjustment, the signal mixing ratio can be prevented from changing. However, the conventionally-known mixing apparatus are not constructed with interlocked relation between the gain adjustment of the input ports and the adjustment of the attenuators of the input channels taken into consideration; to date, it has been conventional to perform such adjustment through manual operation by users. Speaking of possible arrangements for interlocking the gain adjustment of a given input port and the adjustment of the attenuator of a corresponding patched-to input channel to each other, the input ports and the input channels may be connected with each other in desired combinations and any of the input ports may be connected to two or more patched-to input channels. However, that the gain of a given input port is adjusted in accordance with adjustment of the attenuator of a given patched-to input channel is practically unreasonable in view of the intended purpose of the attenuator. Therefore, the arrangements for merely interlocking the gain adjustment of a given input port and the adjustment of the attenuator of a corresponding input channel to each other alone are not sufficient.

SUMMARY OF THE INVENTION

In view of the foregoing, it is an object of the present invention to provide an improved digital mixer which, even when gain adjustment of an input port has been made, can prevent the gain adjustment from influencing signal processing in a corresponding patched-to input channel and influencing a mixing ratio of signals supplied from individual input channels to a mixing bus.

In order to accomplish the above-mentioned object, the present invention provides an improved mixing apparatus, which comprises: an input port that inputs an audio signal, adjusts a gain of the inputted audio signal and supplies the audio signal of the adjusted gain in digital representation; a plurality of channels that process signals, each of the channels including a level control section that controls an input level of an audio signal allocated to the channel; an allocation section that allocates the audio signal, supplied from said input port, to one or more desired ones of said plurality of channels; an automatic adjustment section that, in accordance with the gain adjustment in the input port, automatically adjusts level control to be performed by the level control section in each of the channels, having the audio signal of the input port allocated thereto, in a direction to cancel out level variation having occurred due to the gain adjustment in the input port; and a setting section that, for each of the channels, sets an ON/OFF state of an automatic adjustment function of the automatic adjustment section independently of the other channels.

According to the present invention, which is provided with the automatic adjustment section, the level control to be performed by the level control section for each of the channels, to which the audio signal of the input port has been allocated, can be automatically adjusted in a direction to cancel out level variation having occurred due to the gain adjustment in the input port, and the ON/OFF state of the automatic adjustment function can be set by the ON/OFF setting section independently for each of the channels. Because the automatic adjustment function is performed, by the automatic adjustment section, in the channel selected or set as a destination of the signal (i.e., "destination channel"), the gain adjustment of the input port is not varied when the level control operator has been operated in the destination channel. Namely, the automatic adjustment function serves to fix the signal, to be used for signal processing in each of the channel, at a given constant level irrespective of the gain adjustment performed in the corresponding input port whose audio signal has been allocated to the channel. Even when the gain of a given input port has been adjusted, each of the channels, to which the audio signal has been allocated, can perform signal processing without being influenced by level variation resulting from the gain adjustment in the input port. Thus, the mixing apparatus of the present invention can achieve the superior benefit that a mixing ratio among signals of the individual channels can be prevented from being influenced even when the gain of the input port has been adjusted.

The present invention may be constructed and implemented not only as the apparatus invention as discussed above but also as a method invention. Also, the present invention may be arranged and implemented as a software program for execution by a processor such as a computer or DSP, as well as a storage medium storing such a software program. Further, the processor used in the present invention may comprise a dedicated processor with dedicated logic built in hardware, not to mention a computer or other general-purpose type processor capable of running a desired software program.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

For better understanding of the objects and other features of the present invention, its preferred embodiments will be described hereinbelow in greater detail with reference to the accompanying drawings, in which.

DETAILED DESCRIPTION OF THE INVENTION

Figure 1:
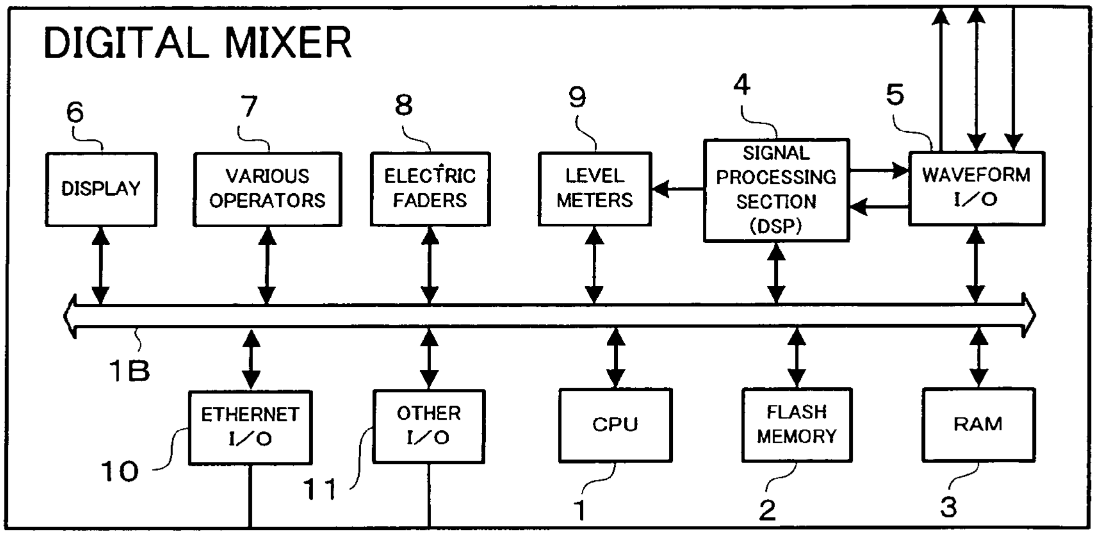
FIG. 1 is a block diagram showing an example hardware setup of a digital mixer in accordance with an embodiment of the present invention.

FIG. 1 is a block diagram showing an example hardware setup of a digital mixer in accordance with an embodiment of the present invention. The digital mixer of FIG. 1 comprises a CPU 101, a flash memory 2, a RAM 3, a signal processing circuit (DSP) 4, a waveform input/output interface (I/O) unit (hereinafter "waveform I/O unit") 5, a display device 6, various operators 7, electric faders 8, level meters 9, an Ethernet interface (I/O) 10, and another interface ("other I/O") 11. The above-mentioned components are connected with one another via a bus 1B. Microcomputer, comprising the CPU 1, flash memory 2 and RAM 3, executes control programs stored in the flash memory 2 or RAM 3 to control the general behavior of the mixer. The DSP 4, which is an engine for performing digital signal processing of the mixer, performs signal processing on digital audio signals, supplied via the waveform I/O unit 5, on the basis of an instruction given from the CPU 1 and then outputs the resultant processed signals to the outside of the digital mixer. The display device 6, various operators 7, electric faders 8 and level meters 9 are user interfaces provided on an operation panel of the digital mixer. The user can use the various operators 7 and electric faders 8 to perform various instructing operation pertaining to mixing processing, i.e. operation for setting various parameters and instructing activation of various functions. Further, the electric faders 8 each have a motor built therein for automatically controlling an operational position of the fader 8; via the motor, the operational position of a knob of the electric fader 8 is automatically controlled on the basis of a drive signal given from the CPU 1. Further, the user can call a display screen corresponding to a desired one of various functions; thus, using GUIs on the display screens, the user is allowed to make settings of the entire mixer and set parameters for the various functions. The level meters 9 are devices for displaying levels of predetermined parameters (such as tone volume and degree of effectiveness of effecters) of an audio signal supplied to the DSP 4.

The waveform I/O unit 5 includes various interfaces for an analog input, analog output, digital input and digital output. Analog audio signal input via the I/O unit 5 is converted into a digital audio signal and then supplied to the DSP 4. The digital audio signal output from the DSP 4 is converted via the I/O unit 5 into an analog audio signal, and the converted analog audio signal is output to the outside of the digital mixer. Further, the digital mixer can communicate digital signals with audio equipment, connected thereto, via the waveform I/O unit 5.

The digital mixer of FIG. 1 may also be connected to a LAN network via the Ethernet I/O 10. Other computer in the LAN network can execute a software program, designed for remote-controlling the digital mixer, to allow the general behavior of the digital mixer of FIG. 1 to be remote-controlled via external equipment. Further, the other computer in the LAN network can also display operating conditions etc. of the digital mixer on its display device. Note that the digital mixer of FIG. 1 may be provided with any other interfaces (e.g., other I/O 11) than the above-described.

In the flash memory 2 or RAM 3, there is provided a current memory area for recording current settings of the digital mixer. Data recorded in the current memory area are various operation data set by the user for the mixing processing, such as settings of parameters for use in signal processing to be performed by the DSP 4. In other words, the DSP 4 performs the signal processing on the basis of the operation data (such as settings of parameters) stored in the current memory area. As any one of the parameter settings etc. is changed, the data in the current memory area, corresponding to the changed parameter or the like, is updated in accordance with the change (e.g., amount of operation), and the updated result is reflected in the signal processing by the DSP 4.

The flash memory 2 includes a "scene memory area", where are set a plurality of sets of scene data comprising various kinds of operation data corresponding to given settings (such as settings of various parameters). The user can store current settings of the digital mixer into the scene memory area as scene data. The user can also read out a desired scene data set from the scene memory area so as to replace the current settings of the digital mixer with the read-out scene data set and thereby automatically reproduce (or recall) given mixing-related settings (i.e., scene).

Figure 2:
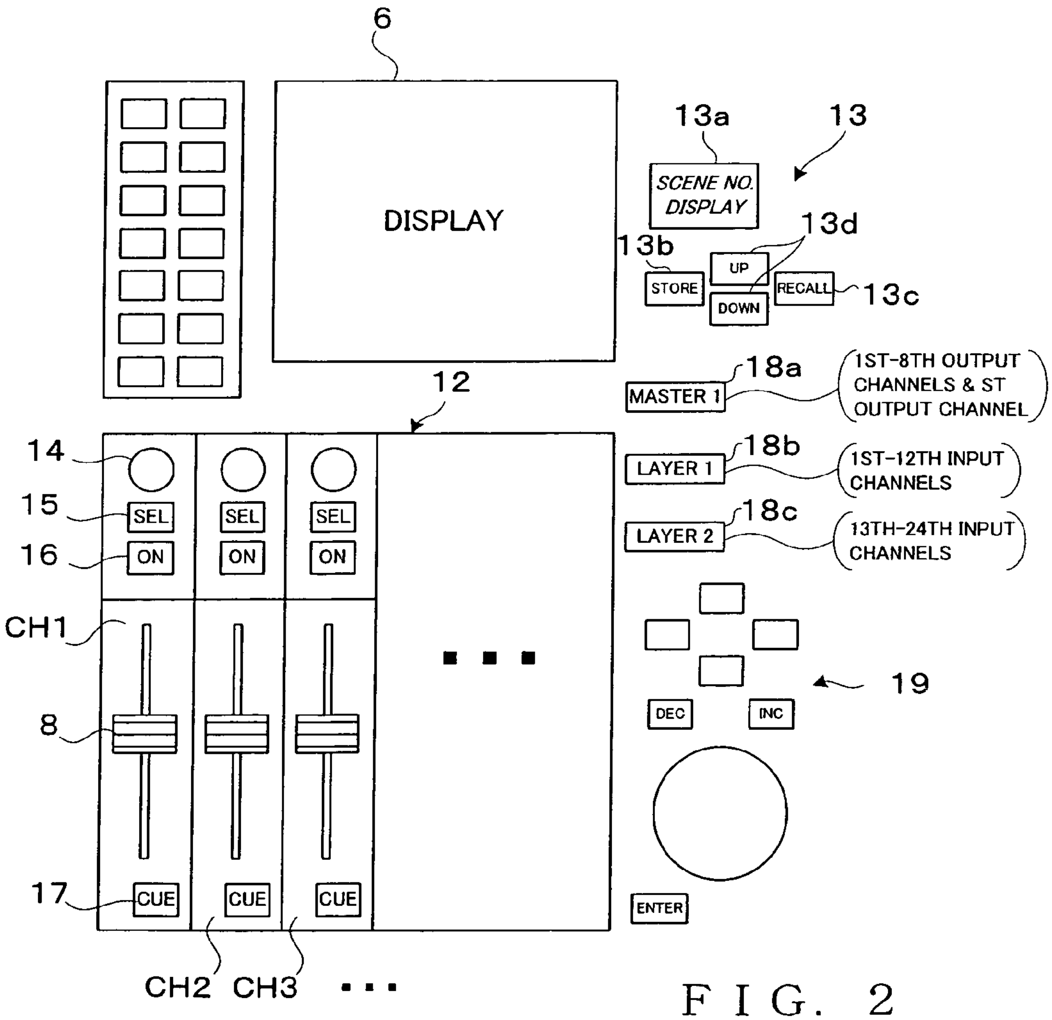
FIG. 2 is a diagram showing an external appearance of a primary part of an operation panel of the digital mixer of FIG. 1.

FIG. 2 is a diagram showing an external appearance of a primary part of the operation panel (mixing console) of the digital mixer of FIG. 1. On the operation panel, as shown in FIG. 2, there are provided the display device 6, channel strip section 12, scene memory control section 13, etc. Various operators (such as switches) shown in FIG. 2 correspond to the various operators 7 shown in FIG. 1.

The channel strip section 12 comprises a plurality of channel strips CH. Let it be assumed here that the channel strip section 12 in the instant embodiment comprises a total of twelve channel strips CH1, CH2, CH3, . . . . Each of the channel strips CH includes: operators for adjusting characteristics and level of a digital signal input to the channel assigned to that channel strip CH, such as the electric fader 8 and knob-type operator 14 for adjusting the level of the signal; a SEL switch 15 for giving an instruction for setting up the assigned channel in a not-shown selected channel section (i.e., module for deploying functions of the assigned channel in detail) and giving an instruction for pairing the assigned channel with another one of the channels; an ON switch 16 for setting an ON/OFF state of the assigned channel; a CUE switch 17 for setting an ON/OFF state of a CUE function (i.e., function for monitoring a tone of a selected channel); and other operators.

The user can use channel any one of assignment switches 18*a*, 18*b* and 18*c* to assign desired input channels or output channels to the channel strips CH of the channel strip section 12. Let it be assumed here that the digital mixer according to the instant embodiment is provided with twenty-four input channels, eight output channels and one stereo output channel (hereinafter "ST output channel"). More specifically, the user can assign the first to eighth output channels and one ST output channel to nine of the channel strips CH via the channel assignment switch 18*a* ("MASTER 1"), assign the first to twelfth input channels to the twelve channel strips CH via the channel assignment switch 18*b* ("LAYER 1"), and assign the thirteenth to twenty-fourth input channels to the twelve channel strips CH via the channel assignment switch 18*c* ("LAYER 2").

As further seen in FIG. 2, the scene memory control section 13 includes a scene number display section 13*a*, scene store switch ("STORE") 13*b*, scene recall switch (RECALL) 13*c*, and scene selection switch ("UP" and "DOWN") 13*d*. Unique number of a scene data set selected by the user as a subject of store or recall is displayed on a scene number display section 13*a*. The scene selection switch ("UP" and "DOWN") 13*d* is operable to increase or decrease the number to be displayed on the scene number display section 13*a*, and the user can use the scene selection switch 13*d* to select a desired scene number as a subject of store or recall. The scene recall switch (RECALL) 13*c* is operable to read out, from the scene memory area, the scene data set corresponding to the number selected via the selection switch 13*d*, so as to recall the scene. Further, the scene store switch ("STORE") 13*b* is operable to store the current parameter settings (i.e., "current scene") of the digital mixer as scene data of the number selected via the scene selection switch 13*d*.

Further, on the operation panel of FIG. 2, there are provided various other operators 19, such as ON/OFF switches of various functions, rotary encoders, increment and decrement switches, cursor keys and enter key (decision key). Using these operators 19, the user can control various operation interfaces on a screen, displayed on the display device 6, to perform various operation, such as parameter setting operation.

Figure 3A:
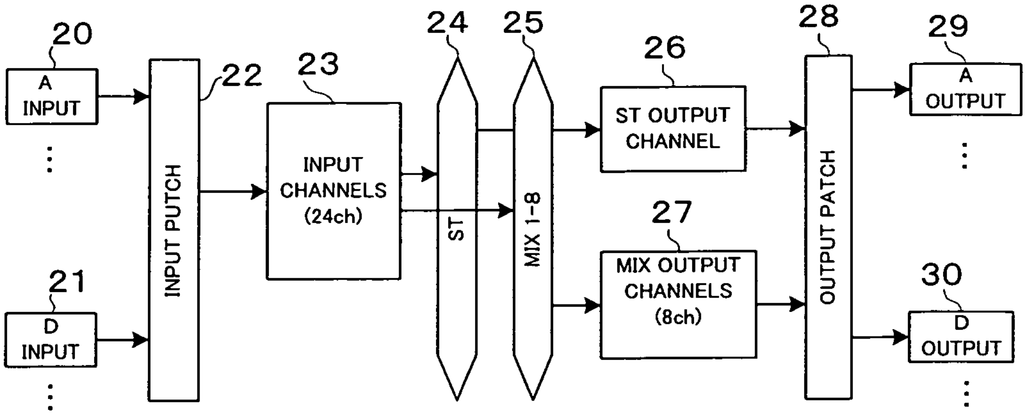
FIG. 3A is a block diagram outlining signal processing arrangements in the embodiment.
Figure 3B:
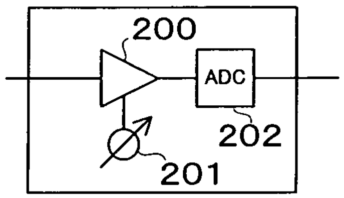
FIG. 3B is a diagram showing a detailed construction of an analog input port in the embodiment.

FIG. 3A is a block diagram outlining example arrangements for the signal processing performed by the DSP 4 in the instant embodiment of the digital mixer. As shown, the digital mixer includes a plurality of analog input ports (A inputs) 20 for inputting analog audio signals, and a plurality of digital input ports (D inputs) 21 for inputting digital audio signals. FIG. 3B shows a detailed construction of one of the analog input ports 20. As shown in FIG. 3B, each of the analog input ports 20, which receives an externally-supplied analog audio signal (input via a microphone or signal line), includes a head amplifier 200 for amplifying the input analog audio signal, gain adjuster 201 for adjusting a gain of the head amplifier 200 and an A/D converter (ADC) 202 for converting the output of the head amplifier 200. In the analog input port 20, the signal input level to the A/D converter 202 can be controlled as necessary by the gain adjuster 201 adjusting the gain of the head amplifier 200. Such gain adjustment is performed to adapt the input signal level to a level range acceptable by the A/D converter 202. Further, each of the digital input ports 21, which receives a digital audio signal, comprises a suitable digital I/O.

Input patch section 22 is a module that selects any one of the analog or digital input ports 20 or 21 for each of the predetermined plurality of (twenty-four in the instant embodiment) input channels and interconnects the selected input port and the input channel. Via this input patch section 22, the user allocates the signal of each of the input ports to any of the input channels. Data indicative of the connections in the input patch section 22 between the individual input channels and the input ports are stored as "patch data" in a suitable memory, such as the flash memory 2 or RAM 3. Note that the signal of the same input port may be allocated to two or more of the input channels.

The twenty-four input channels 23 each perform signal processing on the basis of various parameters set for the input channel to adjust characteristics and level of the digital signal supplied to the input channel. Signal output from each of the input channels is sent to desired one or more of a predetermined plurality of mixing buses (MIX buses); in the illustrated example, there are provided one stereo bus (ST bus) 24 and eight mixing (MIX) buses 25. Signals output from the input channels to any of the ST bus 24 and mixing buses 25 are subjected to the mixing processing performed by the bus 24 or 25 at a mixing ratio corresponding to respective signal output levels of the input channels, and the resultant mixed signals are supplied to the output channels corresponding to the bus. In the illustrated example, the output channels consist of one ST output channel 26 corresponding to the ST bus 24 and eight output channels 27 corresponding to the eight mixing buses 25. Each of the ST output channel 26 and eight output channels 27 performs signal processing on the basis of various parameters, set for the output channel, to adjust characteristics and level of the digital signal supplied thereto.

Output patch section 28 is a module that selects any one of the output channels (ST output channel 26 and output channels 27) for each of analog or digital output ports (A output ports or D output ports) 29 or 30 and interconnects the selected output channel and the output port that is a patched-to destination of the signal of the output channel. Via this output patch section 28, the output signal of each of the output channels is allocated and supplied to any one of the output ports 29 and 30.

Thus, each of the digital audio signals output from the ST output channel 26 and output channels 27 is allocated via the output patch section 28 to any one of the output ports 29 or 30. Each of the analog output ports 29 converts the thus-supplied digital audio signal into analog representation and thereby outputs an analog audio signal. Each of the digital output ports 30 comprises a suitable digital I/O and outputs a digital audio signal.

Figure 3C:
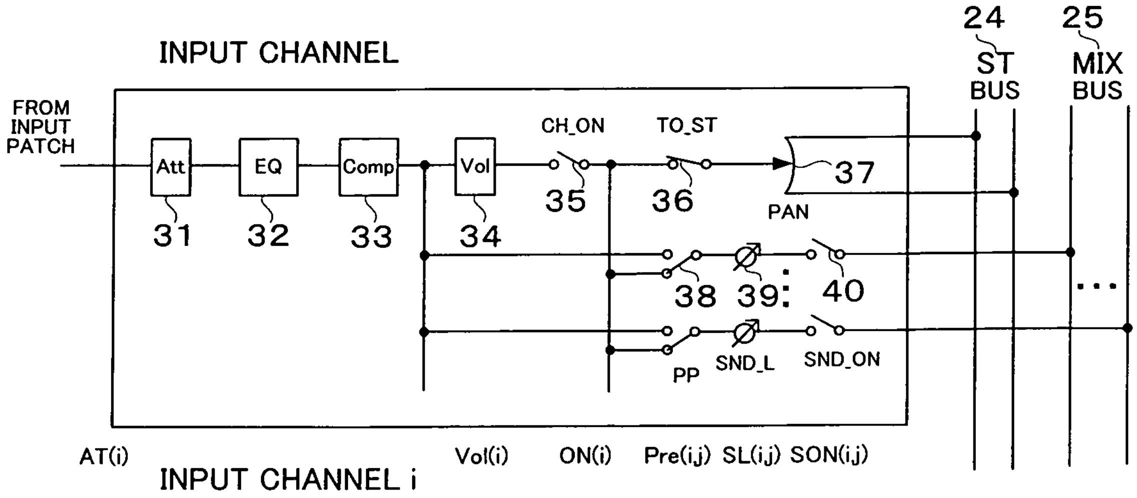
FIG. 3C is a diagram showing an example construction of an input channel in the embodiment.

FIG. 3C is a diagram showing an example of a construction for signal processing in each of the input channels 23 of FIG. 3A. More specifically, in FIG. 3C, the signal processing construction for a given one of the input channels (the given input channel is indicated by reference character "i" for convenience of description). In the input channel i, there are provided, from the input stage of the input channel, a plurality of signal processing modules, i.e. an attenuator (ATT) 31, equalizer (EQ) 32, compressor (Comp) 33 and tone volume fader (Vol) 34 in the order mentioned. The attenuator 31 is a level control mechanism for attenuating or amplifying the level of the digital audio signal, allocated via the input patch section 22 to the input channel i, on the basis of an attenuator parameter setting AT(i) of the input channel. The attenuator 31 is provided for appropriately adjusting the level of the signal, supplied to the input channel, with effects of the equalizer 32 etc., provided at subsequent stages, taken into account.

The equalizer 32 performs equalizing on the output of the attenuator 31 on the basis of an equalizing parameter setting of the input channel, and the compressor 33 imparts a compressor effect to the output of the equalizer 32 on the basis of a compressor setting of the input channel. The tone volume fader 34 controls the tone volume level of the signal, allocated to the input channel, on the basis of a tone volume parameter Vol(i) of the input channel. Channel ON/OFF switch ("CH_ON") 35 switches between ON/OFF states of the output signal of the tone volume fader 34 on the basis of an ON/OFF parameter ON(i) of the input channel, and the ON switch 16 of FIG. 2 corresponds to this channel ON/OFF switch 35. TO_ST switch 36 is provided for switching between output ON and OFF states of the signal of the input channel i to be output to the stereo bus (ST bus) 24. The signal output from the input channel i to the stereo bus 24 is appropriately distributed, via a panning control section ("PAN") 37, to left and right bus lines of the stereo bus 24 on the basis of a panning parameter setting.

On the basis of a pre/post switch parameter Pre(ij), a pre/post switch ("PP") 38 switches between a signal before being processed by the tone volume fader 34 (i.e., pre-fader signal) and a signal after having been processed by the tone volume fader 34 (i.e., post-fader signal), so that one of the pre-fader and post-fader signals thus selected via the pre/post switch 38 is sent to the mixing bus 25. In FIG. 3C, the pre/post switch 38 is shown as being in a post-fader-signal selecting position so that the post-fader signal can be sent to the mixing bus 25. Send (or delivery) level setter ("SEND_L") 39 sets a send level of the signal to be sent to the mixing bus 25 in accordance with a send level parameter SL(ij). In accordance with a send-ON parameter SON(ij), a send-ON/OFF switch ("SND_ON") 40 is provided for switching between send ON and OFF states of the signal to be sent to the mixing bus 25. Signal send (or delivery) paths following the pre/post switch ("PP") 38 are provided in corresponding relation to the plurality of (eight in this case) MIX buses 25, and the user is allowed to set the pre/post switch 38, send level setter 39 and send-ON/OFF switch 40 independently for each of the MIX buses. "j" in the above-mentioned parameters Pre(ij), SL(ij) and SON(ij) indicates a specific bus number of the MIX bus 25 that is a sent-to destination of the signal.

Figure 4:
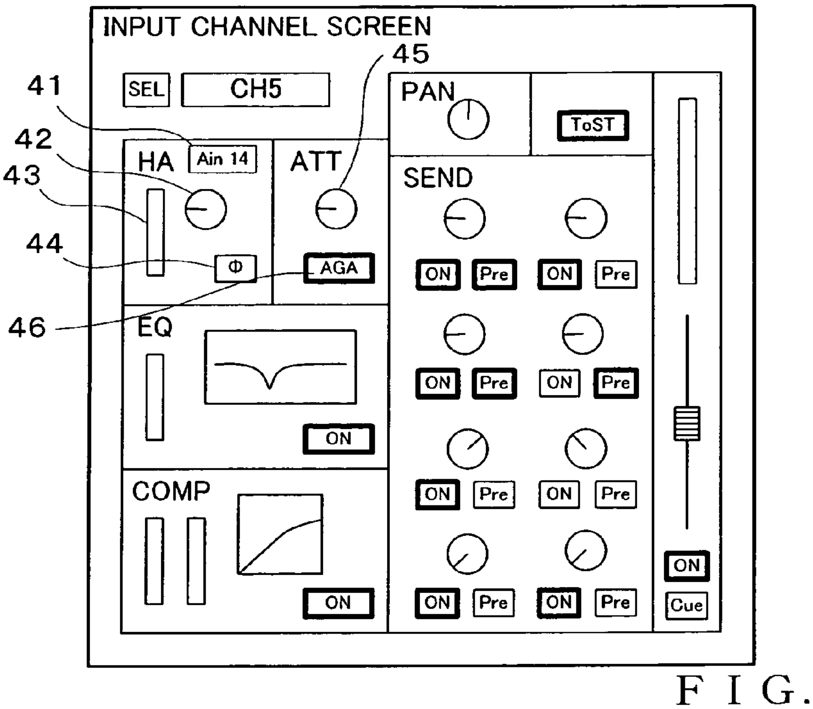
FIG. 4 is a diagram showing an example of a screen displayed on a display device in the embodiment.

FIG. 4 shows an example of a screen displayed on the display device 6 shown in FIG. 2; more particular, FIG. 4 shows an "input channel screen" for setting parameters for a given one of the input channels. In the figure, a character string "CH5" indicated in an upper region of the input channel screen indicates that the fifth input channel has been called to the screen. "SEL" indicated to the left of the character string "CH5" is a button for deploying a window for selecting a channel number to be called to the screen, and the user can cause a desired one of the predetermined plurality of (twenty-four in the instant embodiment) to be called to the screen. On the input channel screen, there are displayed various operation interfaces (e.g., images of buttons, knob-type operators, faders, etc.) for setting parameters of various signal processing modules explained above with reference to FIG. 3. In the figure, ON/OFF states of the switches corresponding to the button images are indicated by the line thicknesses of the button images.

Head amplifier section HA indicated immediately below the "SEL" button corresponds to the head amplifier 200 (see FIG. 3B) of the analog input port 20 (see FIG. 3A) connected via the input patch section to the input channel in question, and the number "Ain14" of the input port that is an input source of the channel is displayed in a box 41 located to the right of the section "HA". Gain adjusting knob image 42 corresponds to the gain adjuster 201 of FIG. 3B. Level of the head amplifier HA (before the A/D conversion) is displayed on a level meter 43. Further, a phase inversion button 44 is a switch for switching between ON/OFF states of a phase inversion function of the input signal.

Attenuator section ATT corresponds to the attenuator 31 of FIG. 3C, and the user is allowed to use a knob image 45 to set an attenuator value AT(i) of the input channel to thereby control the input level of the signal patched to the input level. In the attenuator section ATT, there is provided an "AGA" button 46. The "AGA" button 46 is provided for switching between ON/OFF states of an "auto gain adjuster function" to be performed in the instant embodiment. The "auto gain adjuster function" (AGA function) is a function which, when gain adjustment has been performed on the head amplifier HA of any one of the analog input port, automatically adjusts the setting of the attenuator section ATT of the input channel, which is a patched-to destination of the input port, in a direction to cancel out level variation having occurred due to the gain adjustment. Even when the gain of the head amplifier HA has been adjusted, the "auto gain adjuster function" allows level variation, resulting from the gain adjustment, to be canceled out at the input stage (attenuator) in the input channel which is a patched-to destination of the input port (i.e., patched-to input channel), so that signal processing performed at subsequent stages can be prevented from being influenced by the gain adjustment performed on the head amplifier HA of the input port. Thus, the mixing ratio of signals of the input channels in the ST or MIX bus 24 o 25 can be prevented from changing. Details of the "auto gain adjuster function" will be described later.

Further, an equalizer section EQ corresponding to the equalizer 32 of FIG. 3C and compressor section COMP corresponding to the compressor 33 of FIG. 3C each include a switch for switching between ON/OFF states of that effecter (function), level meter indicating an output level or a degree of effectiveness of the effecter, and a graph display for showing a characteristic of the effecter. Once the characteristic graph of any one of the section EQ and section COMP is clicked on, a detailed setting screen of the section EQ or COMP is deployed. In a mix send section SEND, send function setting tools corresponding to the plurality of (eight in this case) MIX buses are displayed, and, for each of the send, there are provided a knob image for send level adjustment (send level setter (SEND_L) 39 of FIG. 3C), pre/post switching button (pre/post switch (PP) 38 of FIG. 3C) and send ON/OFF switching button (corresponding to the send-ON/OFF switching button (SND_ON) 40 of FIG. 3C). Further, in a panning section PAN corresponding to the panning control section (PAN) 37 of FIG. 3C, there is displayed a knob image for panning parameter setting. To the right of the panning section PAN, there is displayed a TO_ST button image (corresponding to the TO_ST switch 36 of FIG. 3C) for switching between output ON and OFF states of a signal to be output to the stereo bus 24. Further, a fader operator image, displayed in a right-end region of the screen, corresponds to the tone volume fader 34 of FIG. 3C and operable to adjust the tone volume parameter Vol(i) of the input channel. Displayed position of the fader operator image varies in response to (i.e., in interlocked relation to) the physical operator (electric fader 8) of the channel strip to which the input channel in question is currently assigned. Tone volume level of the output signal of the fader 34 of the input channel is displayed on a level meter located immediately above the fader operator image. Position at which the tone volume level to be displayed is detected may be selected by the user from among a position preceding or following the tone volume fader 34, position preceding the equalizer (EQ) 32, etc. Further, immediately below the fader operator image, there are displayed an ON/OFF switching button (corresponding to the channel ON/OFF switch ("CH_ON") 35) for the input channel in question, and a CUE-function ON/OFF switch CUE corresponding to the CUE switch 17 of FIG. 2.

Note that, in addition to the "input channel screen" of FIG. 4, various other display screens, corresponding to various functions of the digital mixer, can be displayed on the display device 6. Examples of the other display screens include a screen showing a list of modules for adjusting the gains of the head amplifiers HA of the input ports in association with the patched-to input channels, a screen showing a list of modules for adjusting the attenuators of the individual input channels.

Figure 5A:
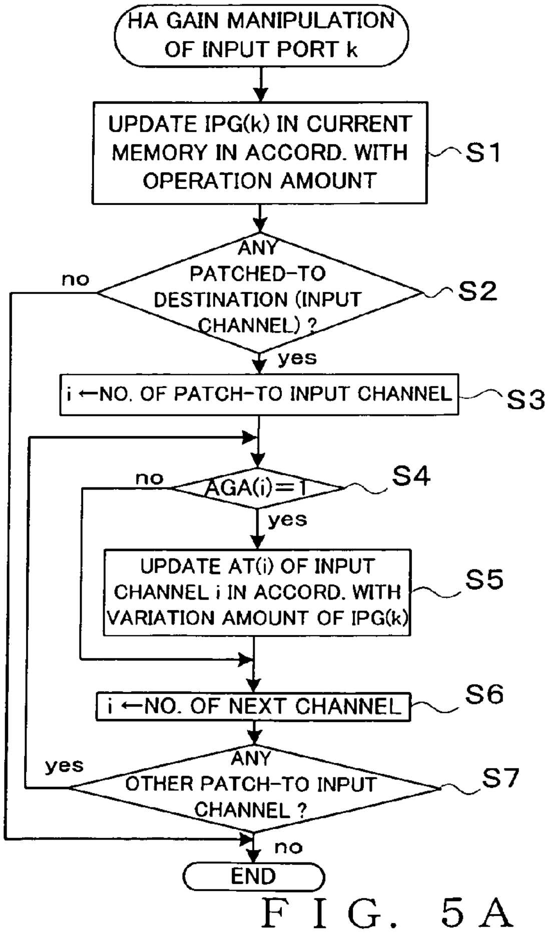
FIG. 5A is a flow chart of auto gain adjuster processing performed in the embodiment in response to head amplifier (HA) gain adjusting operation.

Next, with reference to flow charts of FIGS. 5A and 5B, a description will be given about the auto gain adjuster function (AGA function) performed in the instant embodiment. FIG. 5A shows an example operational sequence of processing carried out in the instant embodiment in response to manipulation of the head amplifier gain (hereinafter "HA gain") (e.g., operation of the knob image 42 for head amplifier gain adjustment on the input channel screen of FIG. 4, operation of the corresponding physical operator, or the like) of any one of the analog input port 20 (hereinafter, this analog input port will be indicated by "k"). Let it be assumed here that a given input channel i has been selected as a patched-to destination of the input port k.

Once the HA gain is manipulated, the HA gain value IPG (k) of the input port k, stored in the current memory area, is updated in accordance with an amount of the manipulation or operation performed by the user. Thus, the gain adjustment corresponding to the HA gain manipulation is reflected in the signal processing by the DSP 4. At step S2, a determination is made as to whether any of the input channels has been set as a patched-to destination for the input port k. If no such patched-to destination has been set (NO determination at step S2), the instant processing is brought to an end. Note that two or more of the input channels may have been designated as patched-to destinations for a given input port k (however, only one input port, not two or more input ports, can be connected with one input channel). If one or more of the input channels have been set as patched-to destinations for the input port k (YES determination at step S2), operations of steps S4-S6 are performed on each of the input channels currently set as patched-to destinations, as will be described below.

At next step S3, the channel number of each of the input channels set as patched-to destinations is set as a channel variable (i) on the basis of the patch data of the input port k. In the case where two or more of the input channels have been set as patched-to destinations, the channel numbers of these input channels are set as channel variables (i), for example, in the order of increasing channel numbers. At step S4, the ON/OFF setting parameter AGA(i) of the "auto gain adjuster (AGA) function" for the channel set as the channel variable (i) is checked. Let it be assumed here that, if the parameter AGA(i) is "1", it indicates that the AGA function is ON, but, if the parameter AGA(i) is "0", it indicates that the AGA function is OFF. Value of the ON/OFF setting parameter AGA(i) is set in accordance with the ON/OFF state of the "AGA" button 46 of the attenuator section ATT on the input channel screen of FIG. 4. If the AGA function is currently set in the ON state (YES determination at step S4), the attenuator parameter value AT(i) of the input channel i stored in the current memory area is updated, at step S5, in accordance with a variation amount of the HA gain value IPG(k) of the input port k connected with the input channel i (i.e., variation amount of the value IPG(k) mentioned above in relation to step S1). The updating of the attenuator parameter value AT(i) serves to vary the parameter value in a direction to cancel out the variation amount of the corresponding value IPG(k). Specifically, if the corresponding value IPG(k) has been increased by "1 dB", the value AT(i) is decreased by "1 dB", and so on. If two or more input channels have been set as patched-to destinations, the number of the next input channel is set as the channel variable (i), at step S6. If the AGA function is currently set in the OFF state (NO determination at step S4), the processing jumps to step S6. Then, at step S7, a determination is made, on the basis of the value of the channel variable (i), as to whether any input channel designated as the patched-to destination remains to be processed. With a YES determination at step S7, the processing reverts to step S4, so that the operations of steps S4-S6 are performed on the designated input channel remaining to be processed.

Through the aforementioned operations, the attenuator parameter setting of each of the input channels, which have been selected as patched-to destinations for a given input port k and where the AGA function is currently ON, is automatically adjusted in accordance with a variation amount of the HA gain.

Figure 5B:
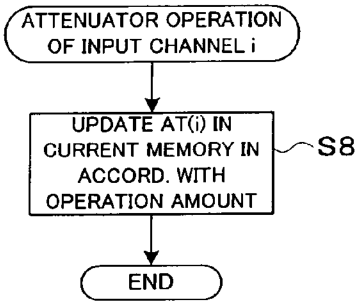
FIG. 5B is a flow chart of showing an example operational sequence of processing carried out in response to operation of an attenuator.

FIG. 5B shows an example operational sequence of processing carried out in the instant embodiment in response to operation of the attenuator of a given input channel i. The operation of the attenuator can be performed using the screen displayed on the display device 6 or physical operator provided on the operation panel. Once the attenuator of the given input channel i is operated, the attenuator parameter value AT(i) of the input channel i, stored in the current memory area, is updated in accordance with an amount of the operation performed by the user (step S8).

If the AGA function of the input channel i is currently set in the ON state, it means that the attenuator parameter value AT(i) of the input channel i has been automatically adjusted in accordance with an amount of variation of the HA gain of the input port k connected with the input channel i (step S5). Thus, the attenuator parameter value AT(i) having been automatically adjusted in the aforementioned manner is used as an initial value at the time of operation of the attenuator. In the case where the attenuator parameter value AT(i) has been automatically adjusted by the AGA function, it appears superficially that the attenuator level has been varied in accordance with the attenuator parameter value AT(i). However, the automatically-adjusted result is only offset from the previous attenuator parameter value AT(i) in accordance with the amount of variation of the HA gain; thus, in actuality (i.e., auditorily), it is possible to operate the attenuator with a level feeling as if the previous attenuator parameter value AT(i) were the initial value. Note that, even when the AGA function of the input channel i is ON and the attenuator of the input channel i has been operated, the HA gain of the input port having the input channel i as its patched-to destination is not varied in the instant embodiment.

In the field of digital mixers, a so-called pairing function has been known, which allows a user to combine two desired input channels into a pair so that a desired parameter can be varied for the paired input channels in an interlock fashion. Such a pairing function may be employed, for example, in cases where two monaural input channels are paired and a signal of each channel of two-channel stereo audio signals is distributed to individual ones of the paired input channels so that mixing processing is performed on the two-channel stereo audio signals supplied to the paired channels. The user can select any desired parameter that is to be varied in the paired channels simultaneously in an interlocked fashion.

In a case where the attenuator parameter of the input channel i is set in paired relation to the attenuator parameter of another input channel, the pair is canceled compulsorily, in the instant embodiment, once the AGA function of the input channel i is turned on. Further, once the AGA function of the input channel i is turned off, the paired state of the parameter setting parameter is again made valid as before the turning-on of the AGA function. Namely, in the case where the pairing has been canceled compulsorily in response to turning-on of the AGA function, it is restored in response to turning-off of the AGA function.

Figure 6:
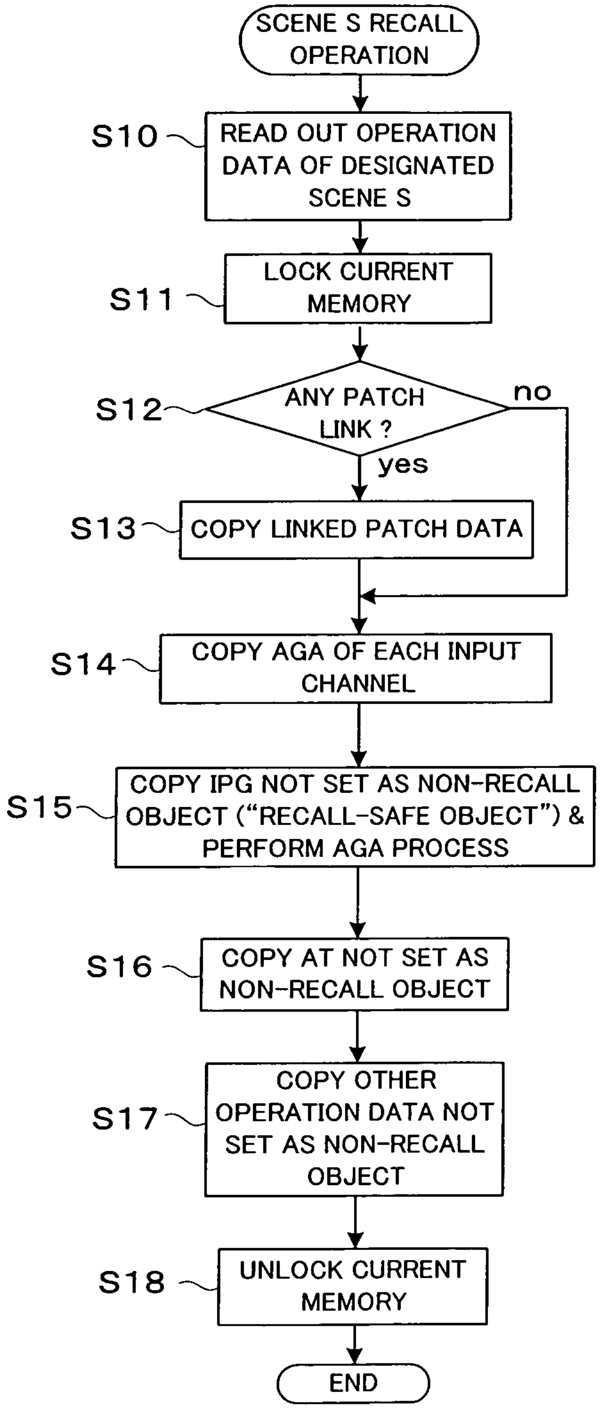
FIG. 6 is a flow chart showing an example operational sequence of scene recall processing performed in the embodiment.

FIG. 6 is a flow chart showing an example operational sequence of scene recall processing performed in the instant embodiment. Once the scene recall switch 13*c* (FIG. 2) is operated by the user, a scene data set (i.e., a set of various operation data) corresponding to the scene S selected by the user is read out from the scene memory area, at step S10 of FIG. 6. The thus read-out scene data set is temporarily stored in a working memory provided in the RAM 3. At step S11, the current memory area is locked so that the stored contents of the current memory area are not reflected in the signal processing by the DSP 4. Each of the scene data sets contains a variety of operation data. At the time of the scene recall, all of the operation data contained in the scene S must be made valid concurrently. Thus, in the scene recall, the current memory area is locked first (step S11 above) to prevent the stored contents of the current memory area from being reflected in the signal processing by the signal processing section, and then the operation data of the scene S are sequentially written into the current memory area through operations at and after step S12 as will be described below. Then, upon completion of the sequential operation data writing, the current memory area is unlocked to allow the stored contents of the current memory area to be reflected in the signal processing by the DSP 4.

In the scene recall, the user can make non-recall ("recall-safe") setting on some of desired operation data to be recalled. Operation data set as an non-recall subject or object is not recalled (for overwriting). Such non-recall setting can be made per signal processing module of each of the input and output channels (e.g., HA module, ATT module, EQ module, COMP module, tone volume fader module, SEND module or the like). Further, non-recall setting can be made independently for each signal processing module (e.g., DCA, effecter, GEQ or the like) that does not belong to any one of the input and output channels.

At step S12, patch link data in the read-out scene data set is checked. Note that each scene data set includes no patch data (i.e., operation data for patching) itself but includes "patch link data" for linking to particular patch data. If the read-out scene data set includes patch link data (YES determination at step S12), linked-to patch data (i.e., patch data to which the scene data set is to be linked) is copied, at step S13, on the basis of the patch link data and written into the current memory area. In the read-out scene S, for each of the input channels, whose patching has been changed, the AGA function of the patching-changed channel does not work even when it is in the ON state, because there is nothing about retaining the level that was set before the recall.

Then at step S14, AGA (Auto Gain Adjustment) operation data of the individual input channels are copied from the read-out scene data set and written into the current memory area. The AGA settings recalled here are reflected in subsequent processing. Namely, for each input channel where the AGA function is ON, the value of the attenuator AT is automatically adjusted by the AGA function when the HA gain of a given input port patched to the input channel has been adjusted and in accordance with the gain adjustment in the input port. The AGA operation data is never set as a non-recall ("recall-safe") object; namely, the AGA operation data is an object that is always recalled.

At following step S15, for each input channel where the HA module has been set as a non-recall object, the HA gain value IPG of a given analog input port is copied from the read-out scene data set and written into the current memory area.

Here, if the AGA function is ON, the operations at and after step S3 of FIG. 5A are carried out, so that a value AT' having been automatically adjusted in accordance with variation of the gain value IPG copied from the scene data set is written, as the attenuator value AT of the input channel, into the current memory. In the case where the analog input port has been patched to two more input channels including that input channel, the respective attenuator values AT of these patched-to input channels will be automatically adjusted in accordance with variation of the gain value IPG. If, on the other hand, the AGA function is OFF, the attenuator value AT of the input channel is not automatically adjusted at this stage, irrespective of variation in the IPG copied from the scene data set. Note that, for each input channel where the HA module has been set as a non-recall object, the same HA gain value IPG as before the recall is maintained.

Namely, because the HA gain of each of the input channels is recalled at step S15 after the AGA function of each of the input channels has been set to the ON or OFF state at step S14, the AGA function can be caused to work on the recall operation of the HA gain.

At next step S16, the attenuator value AT of each input channel where the ATT module has not been set as a non-recall object is copied from the read-out scene data set and written into the current memory area. Thus, for each input channel where the ATT module is not set as a non-recall object, the value AT' having been automatically adjusted by the AGA function at step S15 above is overwritten with the attenuator value AT included in the scene data set. Namely, the attenuator parameter value AT recalled as scene data is given priority over the value AT' automatically adjusted by the AGA function. If, on the other hand, the ATT module is set as a non-recall object and the AGA function of the input channel is ON, the value AT' automatically adjusted by the AGA function is employed at step S14; if the AGA function of the input channel is OFF, the same attenuator value AT as before the recall is maintained.

The operations carried out at steps S15 and S16 may be summarized as follows.

(1) Where neither the HA module nor ATT module is set as a non-recall object, the HA gain value IPG and attenuator value AT are set in accordance with the scene data.

(2) Where the HA module is set as a non-recall object, the HA gain value IPG is excluded from the scene recall (i.e., not recalled from the scene), but the attenuator value AT is set in accordance with the scene data.

(3) Where the ATT module is set as a non-recall object, the HA gain value IPG is set in accordance with scene data. If the AGA function is ON, the attenuator value AT is automatically adjusted in accordance with a variation amount of the HA gain value IPG set in accordance with the scene data.

(4) Where the HA module and ATT module are both set as non-recall objects, both of the HA gain value IPG and attenuator value AT are maintained at the same values as before the recall.

Therefore, in the case of (3) above, a scene recall using the AGA function is permitted if the AGA function is ON.

At step S17, the operation data for all of the other factors (input an output channels and various other modules), not set as non-recall objects, are copied from the scene data set and written into the current memory area. At following step S18, the current memory is unlocked upon completion of writing, into the current memory area, of all of the operation data of the scene, to allow the stored contents of the current memory area to be reflected in the processing by the CPU 4. In this way, all of the operation data of the recalled scene data set are made valid concurrently, so that the mixing state of the scene S can be reproduced.

According to the instant embodiment as described above, when the HA gain of a given analog input port has been adjusted, the attenuator value AT of each patched-to input channel that is a patched-to destination of the input port is automatically adjusted, by the AGA function, so as to cancel out the HA gain adjustment. Thus, in the digital mixer where the input ports and the input channels are connected via the input patch section, there can be achieved the superior benefit that the mixing ratio among signals of the individual input channels is not influenced even when the HA gain of any one of the input ports has been adjusted.

Whereas the embodiment has been described above in relation to the case where the input channel screen of FIG. 4 includes the button 46 for setting the ON/OFF state of the AGA function of the input channel called to the screen, the ON/OFF state setting or switching of the AGA function may be performed via a corresponding physical switch provided on the operation panel of FIG. 2. For example, the ON/OFF state switching of the AGA function for each of the input channel may be performed via the ON/OFF switch 16 provided in the corresponding channel strip. In this case, the ON/OFF state of the AGA function can be set for each of the input channels assigned to the channel strips.

One example manner in which the ON/OFF setting arrangement of the AGA function may be effectively used is explained below.

When signal input equipment, such as a microphone, has been connected to a given input port, the HA gain of the input port is adjusted, then the AGA function of each of the input channels, supplied with a signal from the input port, is turned on, and thence the mixing processing is started. Here, even when the attenuator of the input channel has been operated, the HA gain of the input port having the input channel as its patched-to destination does not vary, by virtue of the AGA function arranged to automatically adjust the attenuator in accordance with a variation amount of the HA gain. By setting the AGA function of each of the input channels, supplied with the signal from the input port, to the ON state, the attenuator of each patched-to input channel is automatically adjusted when the HA gain of the input port is adjusted at a later time. Thus, the signal (i.e., output signal of the attenuator) to be used in the signal processing in each patched-to input channel can be fixed at a constant level without the user operating the attenuator of the patched-to input channel. Therefore, the provision of the AGA function ON/OFF switching arrangement in all of the input channels is very useful.

What is claimed is:

1. A mixing apparatus comprising:

an input port for receiving an audio signal, the input port being configured to adjust a gain of the received audio signal and to output the audio signal with adjusted gain in digital representation, wherein a plurality of the input ports are provided, and the gain adjustment can be performed independently for each of said input ports;

a plurality of channels that process signals, each of the channels including a level control section that controls an input level of an audio signal allocated to the channel;

an allocation section that allocates the audio signal, supplied from each of said input ports, to one or more desired ones of said plurality of channels, wherein each of the channels can receive the audio signal from any one of the input ports that has been allocated thereto;

a plurality of mixing buses, each capable of mixing the audio signals supplied from one or more of said channels to the mixing bus;

an automatic adjustment section that, in accordance with gain adjustment in said input ports, automatically adjusts level control to be performed by the level control section in each of the channels, having the audio signal of a corresponding one of said input ports allocated thereto, to compensate for level variation having occurred due to the gain adjustment in the corresponding one of said input ports; and a setting section that sets an ON/OFF state of an automatic adjustment function of said automatic adjustment section independently for each channel, wherein the automatic adjustment section further determines the gain adjustment in a respective one of said input ports, and wherein automatically adjusting the level control in accordance with gain adjustment in said input ports includes automatically adjusting the level control based on the gain adjustment determined as for the corresponding one of said input ports.

2. The mixing apparatus as claimed in claim 1 wherein each of said input ports includes a manually-operable gain adjuster for adjusting the gain of the received audio signal irrespective of the respective ON/OFF setting of the automatic adjustment function of said automatic adjustment, wherein the respective level control section of each channel includes a manually-operable level control operator for controlling the level of the audio signal in the respective channel, and wherein, for each of the channels for which the automatic adjustment function is currently set in the ON state by said setting section, said automatic adjustment section automatically adjusts, in accordance with gain adjustment by the gain adjuster of the corresponding one of said input ports, an input level of the channel to be controlled by the level control section in accordance with operation of the level control operator.

3. The mixing apparatus as claimed in claim 2 wherein the level control operator of each of the channels is an automatically-operable operator, and an operating position of the level control operator is automatically moved in response to automatic adjustment, by said automatic adjustment section, of the input level of the channel responsive to the gain adjustment by the gain adjuster of the corresponding one of said input ports.

4. The mixing apparatus as claimed in claim 2 wherein, irrespective of the ON/OFF setting of the automatic adjustment function set by said setting section, a gain of the gain adjuster is not automatically adjusted even when the level control operator has been operated.

5. The mixing apparatus as claimed in claim 1 wherein each of said input ports includes a gain adjuster that performs gain adjustment on the input analog audio signal, and an A/D converter that converts the analog audio signal, having been subjected to the gain adjustment by the gain adjuster, into the digital audio signal.

6. The mixing apparatus as claimed in claim 1, wherein each of the channels includes a characteristic controller that processes the audio signal having been subjected to level control by the level control section, and each of the channels further includes a level setter that controls the level of the audio signal to be supplied from said channel to desired ones of the mixing buses.

7. The mixing apparatus as claimed in claim 1 which further comprises:

a scene data memory that stores scene data for a plurality of scenes, each scene including various settings in said mixing apparatus; and a scene recall control section that selects a scene from among said plurality of scenes and, in accordance with the scene data, stored in said scene data memory, corresponding to the selected scene, automatically collectively makes various settings in said mixing apparatus, and wherein said scene data include ON/OFF setting data that sets, independently for each of said plurality of channels, setting the ON/OFF state of the automatic adjustment function to be performed by said automatic adjustment section, wherein a particular setting function can be selectively excluded from scene recall control, and wherein, when the gain adjustment in said input ports has been automatically set, in scene recall control, in accordance with the scene data, and on condition that a selection has been made to exclude, from the scene recall control, input level control to be performed by the level control section for a given one of the channels, having the audio signal of the corresponding one of said input ports allocated thereto, and that the automatic adjustment function for the given channel has been set to the ON state by the ON/OFF setting data, automatic level adjustment to be performed by said automatic adjustment section for the given channel is made valid, so that the input level control to be performed by the level control section for the given channel, excluded from the scene recall control, is automatically adjusted in the direction to cancel out level variation having occurred due to automatic gain adjustment in the corresponding one of said input ports.

8. The mixing apparatus as claimed in claim 1 which further comprises:

a scene data memory that stores scene data for a plurality of scenes, each scene including various settings in said mixing apparatus; and a scene recall control section that selects a scene from among said plurality of scenes and, in accordance with the scene data, stored in said scene data memory, corresponding to the selected scene, automatically collectively makes various settings in said mixing apparatus, and wherein said scene data include ON/OFF setting data that sets, independently for each of said plurality of channels, setting the ON/OFF state of the automatic adjustment function to be performed by said automatic adjustment section, and wherein, in scene recall control, said setting section sets the ON/OFF state of the automatic adjustment function for each of said channels in accordance with the ON/OFF setting data included in the scene data.

9. A non-transitory computer readable storage medium storing a program for causing a computer of a mixer apparatus to perform automatic adjustment on an input level of a signal, the mixing apparatus including: a plurality of input ports each configured to receive an audio signal, adjust a gain of the received audio signal and output the audio signal with adjusted gain in digital representation, wherein the gain adjustment can be performed independently for each of said input ports; a plurality of channels that process signals, each of the channels including a level control section that controls an input level of an audio signal allocated to the channel; an allocation section that allocates the audio signal, supplied from each of said input ports, to one or more desired ones of said plurality of channels, each of the channels being capable of receiving the audio signal from any one of the input ports that has been allocated thereto; and a plurality of mixing buses each capable of mixing the audio signals supplied from one or more of said channels to the mixing bus, said program comprising:

a step of, for each of the channels, setting an ON/OFF state of an automatic adjustment function independently of other said channel;

a step of determining the gain adjustment in a respective one of said input ports; and a step of, in accordance with the gain adjustment in said input ports, automatically adjusting level control to be performed by the level control section in each of the channels, which has the audio signal of a corresponding one of said input ports allocated thereto and for which the automatic adjustment function is currently set in the ON state, to compensate for level variation having occurred due to the gain adjustment in the corresponding one of said input ports, wherein automatically adjusting the level control in accordance with gain adjustment in said input ports includes automatically adjusting the level control based on the gain adjustment determined as for the corresponding one of said input ports.

10. A mixing apparatus comprising:

a plurality of input ports, each input port receives an audio signal, adjusts a level of the audio signal in accordance with a value of a first parameter and supplies the audio signal of the adjusted level in digital representation, wherein the level adjustment can be performed independently for each of said input ports;

a first setting section that changes the value of said first parameter of any port in response to a first operation by a user;

a plurality of channels, each channel performs signal processing on an audio signal supplied to the channel so as to control characteristic of the audio signal, said signal processing including a level control for controlling a level of the audio signal in accordance with a value of a second parameter at a input stage of said signal processing;

a second setting section that changes the value of said second parameter of any channel in response to a second operation by the user;

an allocation section that allocates the audio signal, supplied from each of said input ports, to one or more desired ones of said plurality of channels, and supplies the audio signal from the input port to the allocated ones of said plurality of channels, wherein each of the channels can receive the audio signal from any one of the input ports that has been allocated thereto;

a plurality of mixing buses, each capable of mixing the audio signals supplied from one or more of said channels to the mixing bus;

an automatic adjustment section that, when the value of said first parameter of one port is changed by said first setting section, automatically adjusts the value of said second parameter of each channel, of which a third parameter is set to ON state, and to which the audio signal from the one input port is allocated by said allocation section, so as to cancel out level variation of the audio signal output from said first stage of the channel, having occurred due to the change of the value of said first parameter of the one input port by said first setting section; and a third setting section that sets said third parameter of any channel to either ON state or OFF state in response to a third operation by the user, wherein the automatic adjustment section further determines the value of said first parameter of one port, and wherein automatically adjusting the value of said second parameter of each channel of which a third parameter is set to ON state includes automatically adjusting based on the determined value of said first parameter.

11. The mixing apparatus as claimed in claim 10 wherein said first setting section adjusts the value of said first parameter, of an input port, in accordance with the first operation on a first level control, provided for the input port, by the user and irrespective of the state of the third parameter set by the third setting section, wherein said second setting section controls the value of the second parameter of a channel in accordance with the second operation on a second level control, provided for the channel, by the user, and wherein for each channel of which the third parameter is set to the ON state, said automatic adjustment section automatically adjusts the value of said second parameter in accordance with the first operation on the first level control by the user.

12. The mixing apparatus as claimed in claim 11 wherein the second level control is an automatically-operable control, and when the automatic adjustment section automatically adjusts the value of said second parameter in accordance with the first operation on the first level control, a position of the second level control is automatically moved in accordance with the value of the second parameter.

13. The mixing apparatus as claimed in claim 11 wherein, irrespective of state of the third parameter set by the third setting section, the value of said first parameter of each port does not changes even when the second level control of a channel is operated by the user.

14. The mixing apparatus as claimed in claim 10 wherein said input port includes an A/D converter that converts an analog audio signal into a digital audio signal, wherein said audio signal which said input port receives is an analog audio signal, and wherein said audio signal which said input port supplies is a digital audio signal converted by the A/D converter.

15. The mixing apparatus as claimed in claim 10 which further comprises a plurality of mixing buses for mixing the audio signals supplied to said mixing buses by said channels, and wherein said signal processing of each channel further includes a set of level controls for controlling levels of audio signals to be supplied from said channel to desired ones of the mixing buses.

16. The mixing apparatus as claimed in claim 10 which further comprises:

a scene data memory that stores scene data for a plurality of scenes, the scene data of each scene including values of various parameters for controlling various settings in said mixing apparatus; and a scene recall control section that selects a scene from among said plurality of scenes and, in accordance with the scene data of the selected scene, stored in said scene data memory, automatically collectively makes up various settings in said mixing apparatus, and wherein said scene data includes the value of said third parameter of each channel as one of said various parameters, and wherein, when the scene recall control section makes various settings in said mixing apparatus, said third parameter of each channel in said mixing apparatus is set either ON state or OFF state in accordance with the value of third parameter of the channel included in the selected scene data.

* * * * *